(12) United States Patent
Lin et al.

(10) Patent No.: US 9,711,475 B2
(45) Date of Patent: Jul. 18, 2017

(54) BUMP STRUCTURAL DESIGNS TO MINIMIZE PACKAGE DEFECTS

(71) Applicant: TAIWAN SEMICONDUCTOR MANUFACTURING COMPANY, LTD., Hsinchu (TW)

(72) Inventors: Jing-Cheng Lin, Chu Tung Zhen (TW); Cheng-Lin Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/879,710

(22) Filed: Oct. 9, 2015

(65) Prior Publication Data

US 2016/0035687 A1 Feb. 4, 2016

Related U.S. Application Data

(60) Continuation of application No. 14/210,817, filed on Mar. 14, 2014, now Pat. No. 9,159,589, which is a
(Continued)

(51) Int. Cl.
*H01L 23/00* (2006.01)
*H01L 23/498* (2006.01)
(Continued)

(52) U.S. Cl.
CPC .............. *H01L 24/16* (2013.01); *H01L 21/56* (2013.01); *H01L 21/563* (2013.01); *H01L 23/49816* (2013.01); *H01L 23/49894* (2013.01); *H01L 24/13* (2013.01); *H01L 24/81* (2013.01); *H01L 23/3171* (2013.01); *H01L 24/02* (2013.01); *H01L 24/05* (2013.01); *H01L 24/11* (2013.01); *H01L 24/83* (2013.01); *H01L 2224/0239* (2013.01); *H01L 2224/0401* (2013.01); *H01L 2224/05008* (2013.01); *H01L 2224/05166* (2013.01); *H01L 2224/05181* (2013.01); *H01L 2224/05187* (2013.01);
(Continued)

(58) Field of Classification Search
CPC ......... H01L 24/16; H01L 24/13; H01L 24/81; H01L 21/56; H01L 21/563; H01L 23/49816; H01L 23/49894
See application file for complete search history.

(56) References Cited

U.S. PATENT DOCUMENTS 4,811,082 A 3/1989 Jacobs et al.
4,990,462 A 2/1991 Sliwa, Jr.
(Continued)

*Primary Examiner* — John C Ingham
*Assistant Examiner* — Gustavo Ramallo
(74) *Attorney, Agent, or Firm* — Haynes and Boone, LLP

(57) ABSTRACT

A method of forming a chip package includes providing a chip with a plurality of first bumps, wherein the plurality of first bumps has a first height. The method further includes providing a substrate with a plurality of second bumps, wherein the plurality of second bumps has a second height. The method further includes bonding the plurality of first bumps to the plurality of second bumps to form a first bump structure of the chip package, wherein the first bump structure has a standoff, wherein a ratio of a sum of the first height and the second height to the standoff is equal to or greater than about 0.6 and less than 1.

20 Claims, 7 Drawing Sheets

Related U.S. Application Data division of application No. 13/362,913, filed on Jan. 31, 2012, now Pat. No. 8,698,308.

(51) Int. Cl.
*H01L 21/56* (2006.01)
*H01L 23/31* (2006.01)

(52) U.S. Cl.
CPC .............. *H01L 2224/05624* (2013.01); *H01L 2224/05639* (2013.01); *H01L 2224/05644* (2013.01); *H01L 2224/05647* (2013.01); *H01L 2224/11849* (2013.01); *H01L 2224/13005* (2013.01); *H01L 2224/13012* (2013.01); *H01L 2224/13023* (2013.01); *H01L 2224/13024* (2013.01); *H01L 2224/13082* (2013.01); *H01L 2224/13083* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/1601* (2013.01); *H01L 2224/16225* (2013.01); *H01L 2224/16227* (2013.01); *H01L 2224/16238* (2013.01); *H01L 2224/73204* (2013.01); *H01L 2224/81011* (2013.01); *H01L 2224/8191* (2013.01); *H01L 2224/81193* (2013.01); *H01L 2224/81801* (2013.01); *H01L 2224/81815* (2013.01); *H01L 2224/81911* (2013.01); *H01L 2224/83104* (2013.01); *H01L 2224/83855* (2013.01); *H01L 2924/381* (2013.01); *H01L 2924/3841* (2013.01)

(56) References Cited

U.S. PATENT DOCUMENTS

| | | | |
|---|---|---|---|
| 5,075,253 | A | 12/1991 | Sliwa, Jr. |
| 5,380,681 | A | 1/1995 | Hsu |
| 5,481,133 | A | 1/1996 | Hsu |
| 6,002,177 | A | 12/1999 | Gaynes et al. |
| 6,187,678 | B1 | 2/2001 | Gaynes et al. |
| 6,229,216 | B1 | 5/2001 | Ma et al. |
| 6,236,115 | B1 | 5/2001 | Gaynes et al. |
| 6,271,059 | B1 | 8/2001 | Bertin et al. |
| 6,279,815 | B1 | 8/2001 | Correia et al. |
| 6,355,501 | B1 | 3/2002 | Fung et al. |
| 6,434,016 | B2 | 8/2002 | Zeng et al. |
| 6,448,661 | B1 | 9/2002 | Kim et al. |
| 6,461,895 | B1 | 10/2002 | Liang et al. |
| 6,562,653 | B1 | 5/2003 | Ma et al. |
| 6,570,248 | B1 | 5/2003 | Ahn et al. |
| 6,600,222 | B1 | 7/2003 | Levardo |
| 6,607,938 | B2 | 8/2003 | Kwon et al. |
| 6,661,085 | B2 | 12/2003 | Kellar et al. |
| 6,762,076 | B2 | 7/2004 | Kim et al. |
| 6,790,748 | B2 | 9/2004 | Kim et al. |
| 6,887,769 | B2 | 5/2005 | Kellar et al. |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,975,016 | B2 | 12/2005 | Kellar et al. |
| 7,037,804 | B2 | 5/2006 | Kellar et al. |
| 7,056,807 | B2 | 6/2006 | Kellar et al. |
| 7,087,538 | B2 | 8/2006 | Staines et al. |
| 7,151,009 | B2 | 12/2006 | Kim et al. |
| 7,157,787 | B2 | 1/2007 | Kim et al. |
| 7,215,033 | B2 | 5/2007 | Lee et al. |
| 7,276,799 | B2 | 10/2007 | Lee et al. |
| 7,279,795 | B2 | 10/2007 | Periaman et al. |
| 7,307,005 | B2 | 12/2007 | Kobrinsky et al. |
| 7,317,256 | B2 | 1/2008 | Williams et al. |
| 7,320,928 | B2 | 1/2008 | Kloster et al. |
| 7,345,350 | B2 | 3/2008 | Sinha |
| 7,402,442 | B2 | 7/2008 | Condorelli et al. |
| 7,402,515 | B2 | 7/2008 | Arana et al. |
| 7,410,884 | B2 | 8/2008 | Ramanathan et al. |
| 7,432,592 | B2 | 10/2008 | Shi et al. |
| 7,494,845 | B2 | 2/2009 | Hwang et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,576,435 | B2 | 8/2009 | Chao |
| 7,834,450 | B2 | 11/2010 | Kang |
| 8,178,970 | B2 | 5/2012 | Shen et al. |
| 8,698,308 | B2 * | 4/2014 | Lin .................. H01L 24/13 257/673 |
| 2004/0046264 | A1 * | 3/2004 | Ho .................. H01L 21/563 257/778 |
| 2005/0140028 | A1 | 6/2005 | Venkateswaran |
| 2006/0211171 | A1 | 9/2006 | Tummala et al. |
| 2009/0146303 | A1 * | 6/2009 | Kwon ............ H01L 23/49816 257/741 |
| 2009/0283914 | A1 | 11/2009 | Murayama |
| 2010/0155115 | A1 | 6/2010 | Pang et al. |
| 2010/0314756 | A1 | 12/2010 | Lii et al. |
| 2011/0092064 | A1 | 4/2011 | Liu et al. |
| 2011/0101527 | A1 * | 5/2011 | Cheng ................ H01L 24/11 257/738 |
| 2011/0233761 | A1 | 9/2011 | Hwang et al. |
| 2012/0091577 | A1 | 4/2012 | Hwang et al. |
| 2013/0223014 | A1 | 8/2013 | Lin et al. |

* cited by examiner

BUMP STRUCTURAL DESIGNS TO MINIMIZE PACKAGE DEFECTS

PRIORITY CLAIM

The present application is a continuation of U.S. application Ser. No. 14/210,817, filed Mar. 14, 2014, which is a divisional of U.S. application Ser. No. 13/362,913, filed Jan. 31, 2012, now U.S. Pat. No. 8,698,308, issued Apr. 15, 2014, which are incorporated by reference herein in their entireties.

BACKGROUND

The fabrication of modern circuits typically involves many processing operations. Integrated circuits are first fabricated on a semiconductor wafer, which contains multiple duplicated semiconductor chips, each comprising integrated circuits. The semiconductor chips are then sawed from the wafer and packaged. The packaging processes have two main purposes: to protect delicate semiconductor chips, and to connect interior integrated circuits to exterior connections.

In packaging integrated circuit (IC) chips, solder joining is one method for bonding IC chips to package substrates, which may or may not include integrated circuits and/or other passive components. The package substrates may also include through silicon vias (TSVs). The solder joining process may involve application of flux on solder, solder reflowing, and flux removal. There are many challenges in chip packaging.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figure 1A:
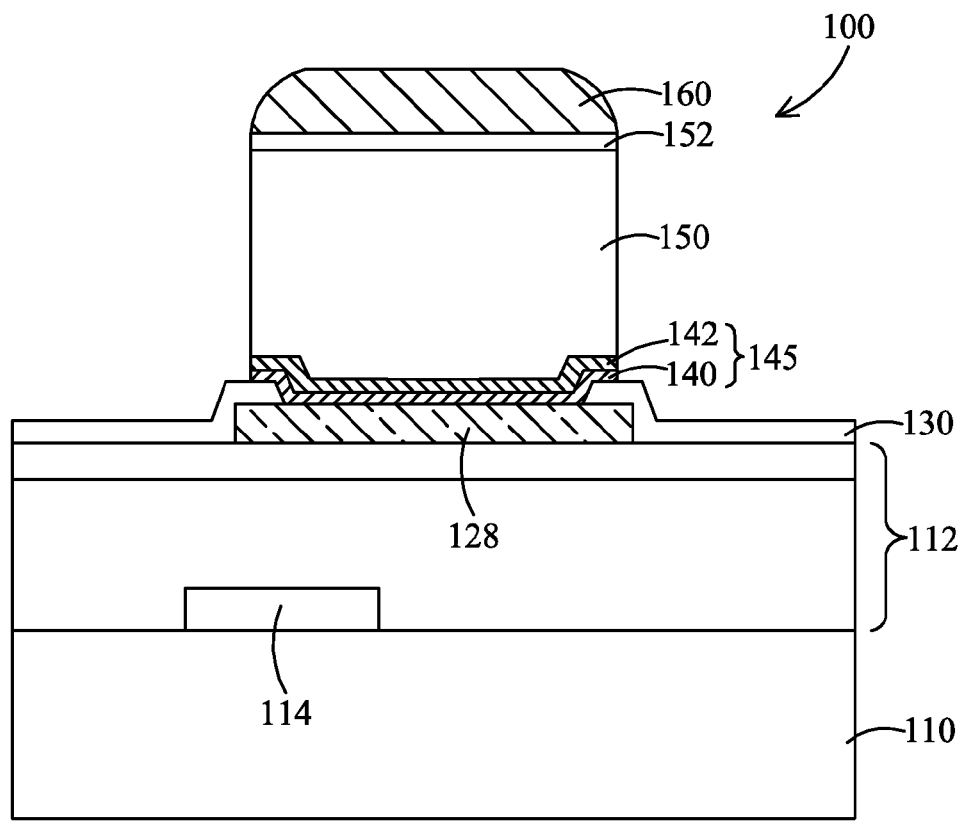
FIG. 1A is a cross sectional view of a bump structure with a substrate, in accordance with some embodiments.

FIG. 1A is a bump structure 100 with a substrate 110, in accordance with some embodiments. Substrate 110 may be a semiconductor substrate, such as a bulk silicon substrate, although it may include other semiconductor materials, such as group III, group IV, and/or group V elements. Semiconductor devices 114, such as transistors, may be formed at the surface of substrate 110. Substrate 110 may include silicon, gallium arsenide, silicon on insulator ("SOI") or other similar materials. Substrate 110 may also include passive devices such as resistors, capacitors, inductors and the like, or active devices such as transistors. Substrate 100 may, in an exemplary embodiment, include additional integrated circuits. Substrate 110 may be an interposer. In addition, the substrate 110 may also be of other materials in alternative embodiments. For example, multiple layer circuit boards may be used. Substrate 110 may also include bismaleimide triazine (BT) resin, FR-4 (a composite material composed of woven fiberglass cloth with an epoxy resin binder that is flame resistant), ceramic, glass, plastic, tape, film, or other supporting materials.

An interconnect structure 112, which includes metal lines and vias (not shown) formed therein and connected to semiconductor devices 114, is formed over substrate 110. The metal lines and vias may be formed of copper or copper alloys, and may be formed using the well-known damascene processes. Interconnect structure 112 may include commonly known inter-layer dielectrics (ILDs) and inter-metal dielectrics (IMDs).

A metal pad 128 is formed over interconnect structure 112. Metal pad 128 may comprise aluminum, and hence may also be referred to as aluminum pad 128, although it may also be formed of, or include, other materials, such as copper, silver, gold, nickel, tungsten, alloys thereof, and/or multi-layers thereof. Metal pad 128 may be electrically connected to semiconductor devices 114, for example, through underlying interconnection structure 112. The metal pad 128 may be a top metal layer or a redistribution layer (RDL). In some embodiments, a passivation layer 130 is formed to cover edge portions of metal pad 128. The passivation layer 130 may be formed of polyimide or other known dielectric materials. Additional passivation layers may be formed over interconnect structure 112 and at the same level, or over, metal pad 128. The additional passivation layers may be formed of materials such as silicon oxide, silicon nitride, un-doped silicate glass (USG), polyimide, and/or multi-layers thereof.

The bump structure 100 includes a diffusion barrier layer 140 and a thin seed layer 142, in accordance with some embodiments. Diffusion barrier layer 140 may be a titanium layer, a titanium nitride layer, a tantalum layer, or a tantalum nitride layer. The materials of seed layer 142 may include copper or copper alloys, and hence is referred to as copper seed layer 142 hereinafter. However, other metals, such as silver, gold, aluminum, and combinations thereof, may also be included. The combined diffusion barrier layer 140 and copper seed layer 142 may also be referred to as an under bump metallurgy (UBM) layer 145.

In some embodiments, bump structure 100 also includes a copper layer 150, a metal layer 152, and a solder layer 160. The copper layer 150, the metal layer 152, and the solder layer 160 are formed by plating with a photo mask defining the openings, in accordance with some embodiments. In some embodiments, metal layer 152 is a nickel-containing layer comprising, for example, a nickel layer or a nickel alloy layer by plating. In some other embodiments, metal layer 152 contains cobalt or tungsten. Metal layer 152 prevents the formation of an inter-metallic compound (IMC) between copper and solder. Solder layer 160 may be a lead-free pre-solder layer formed of, for example, SnAg, or a solder material, including alloys of tin, lead, silver, copper, nickel, bismuth, or combinations thereof. In FIG. 1A, the solder layer 160 is rounded as a result of reflow.

The thickness of copper layer 150 is larger than the thickness of solder layer 160; the bump structure 100 is referred to as a copper post (or pillar) bump. For advanced chip packaging, the bump pitch and bump width are reduced. Copper post bumps enable reduction of bump pitch and width. The embodiment of FIG. 1A is merely an example; other embodiments of bumps are also possible. Further details of bump formation process may be found in U.S. patent application Ser. No. 12/842,617, filed on Jul. 23, 2010 and entitled "Preventing UBM Oxidation in Bump Formation Processes," and U.S. patent application Ser. No. 12/846,353, filed on Jul. 29, 2010 and entitled "Mechanisms for Forming Copper Pillar Bumps," both of which are incorporated herein in their entireties.

Figure 1B:
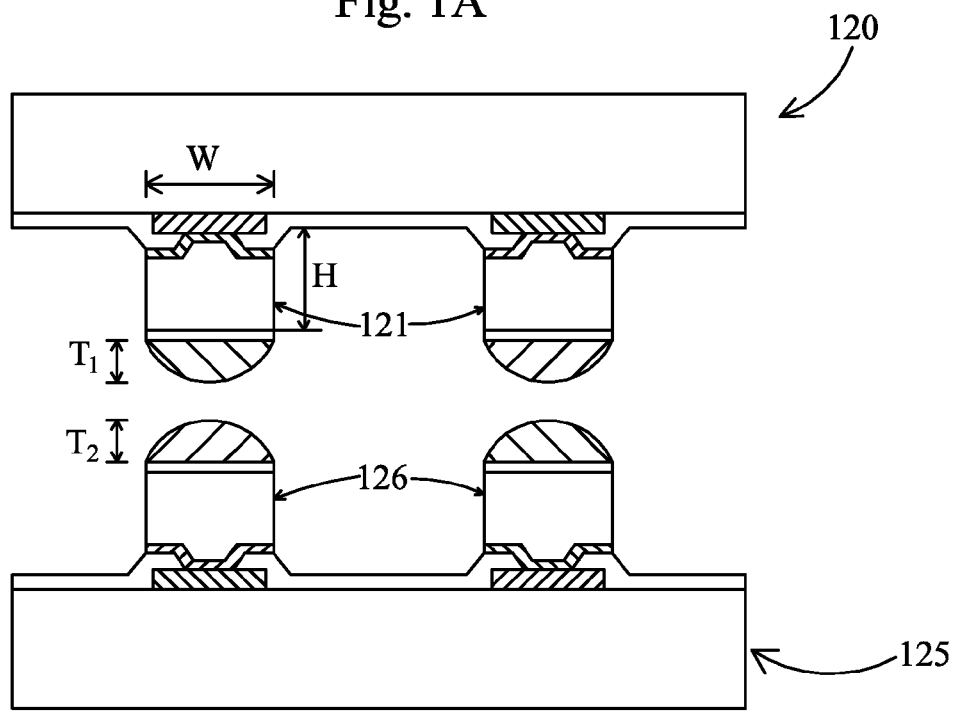
FIG. 1B is a cross sectional view of a chip and a substrate after copper post bumps are formed respectively, in accordance with some embodiments.

FIG. 1B is a cross sectional view of a chip 120 and a substrate 125 after copper post bumps 121 and 126 are formed respectively, in accordance with some embodiments. Substrate 125 may include active or passive devices and may have through silicon vias (TSVs). Copper post bumps 121 are aligned with copper post pumps 126 for bonding.

Figure 1C:
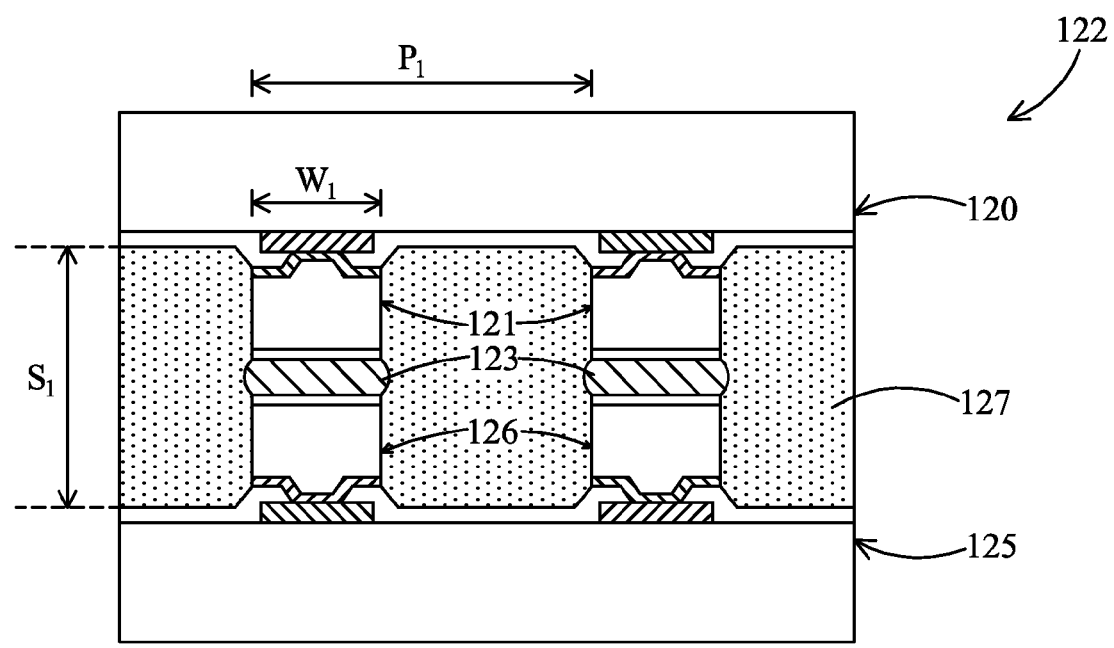
FIG. 1C is a cross-sectional view of a chip bonded to a substrate to form a package, in accordance with some embodiments.

FIG. 1C shows a cross-sectional view of chip 120 bonded to substrate 125 to form package 122, in accordance with some embodiments. A space between chip 120 and substrate 125 is filled with an underfill 127 and a joined solder 123 has a smooth profile. The bump structures in FIG. 1C have a pitch $P_1$ and a standoff (or standoff height) $S_1$. The width of copper post bumps 121 and 126 are $W_1$.

Figure 1D:
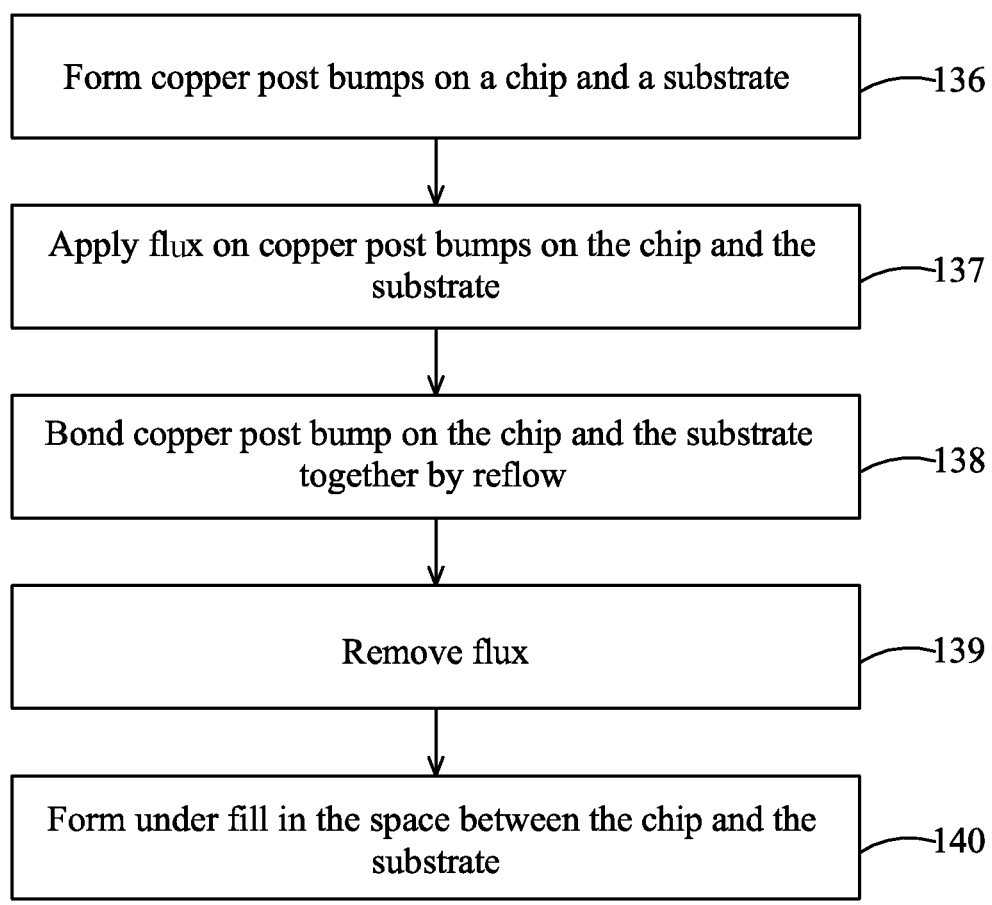
FIG. 1D is a process flow for bonding a chip and a substrate, in accordance with some embodiments.

FIG. 1D shows a process flow 135 for bonding chip 120 and substrate 125, in accordance with some embodiments. At operation 136, copper post bumps are formed on chip 120 and substrate 125. At operation 137, flux is applied on copper post bumps 121 and 126 respectively, in some embodiments. Flux is a chemical cleaning agent that helps prevent oxidation of solder during the solder reflow process. The application of flux may involve dipping bumps in flux or dispensing flux on copper post bumps. In some embodiments, flux is applied to one of copper post bump 121 or 126, but not on both copper post bumps 121 and 126. After flux application is completed, copper post bumps 121 and 126 are bonded together by solder reflow at operation 138. The flux is then removed (or cleaned) from the space between chip 120 and substrate 125, which are bonded together through bumps 121 and 126, at operation 139. Flux removal (or clean) may involve spraying solvent, applying de-ionized (DI) water, heating, and drying the chip package 122, in accordance with some embodiments. After flux is removed, underfill is formed in the space between the chip 120 and substrate 125 at operation 141. Underfill formation may involve injecting the underfill material in the space and also curing the underfill material.

Figure 1E:
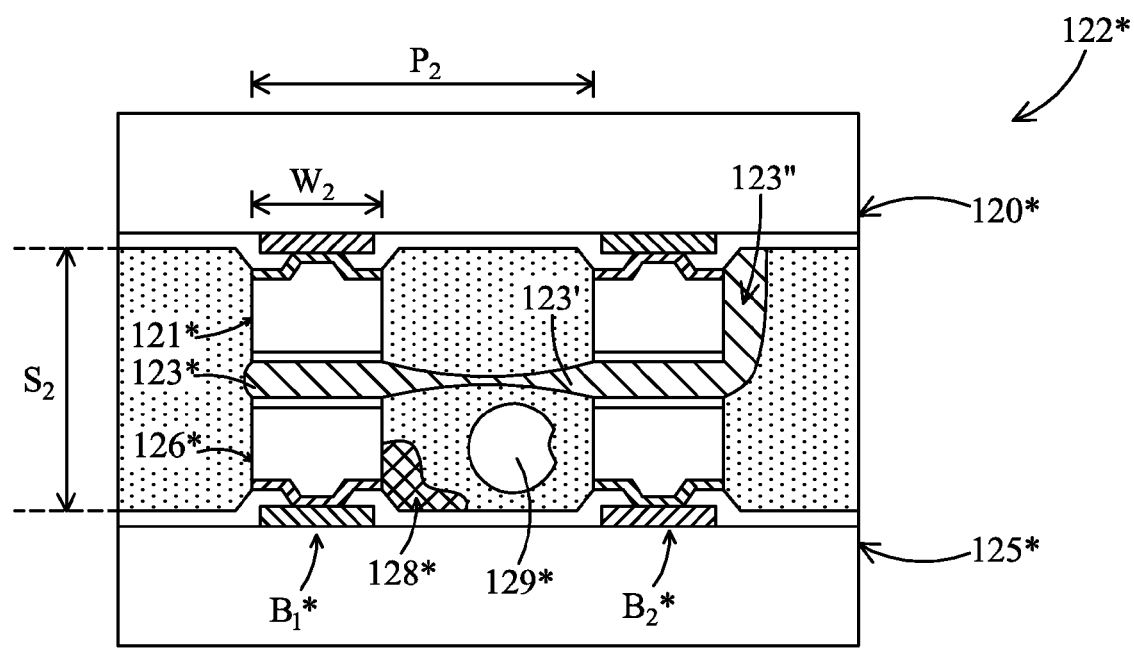
FIG. 1E is a cross sectional view of a chip package, in accordance with some embodiments.

FIG. 1E is a cross sectional view of a chip package 122*, in accordance with some embodiments. Chip package 122* includes a chip 120* and a substrate 125* with copper post bumps 121* and 126* bonded together to form bump structures $B_1$* and $B_2$*. Chip 120*, substrate 125*, bumps 121* and bumps 126* are similar to chip 120, substrate 125, bumps 121, and bumps 126 respectively. Bumps 121* and 126* have smaller pitch, which is distance $P_2$, than copper post bumps 121 and 126, whose pitch is distance $P_1$. The width $W_2$ of copper post 121* and 126* is smaller than $W_1$ of FIG. 1C. The standoff $S_2$ of package 122* is also smaller than standoff $S_1$ of FIG. 1C.

FIG. 1E depicts a bridging of solder 123* between bump structures $B_1$* and $B_2$* (see bridged region 123'), which is a result of narrow pitch and/or an excess amount of solder 123*. Solder bridging causes undesirable signal errors and chip failure. FIG. 1E also shows that some solder 123* overflows the covers the sidewall of copper post 121* (see region 123"), which may also be called as wetting of solder on sidewalls of copper post. Solder wetting on copper post increases the risk of shorting and degradation of copper pillar due to formation of inter-metal compound (IMC) between copper and solder.

As mentioned above in process flow 135, after the copper post bumps 121* and 126* are solder together to form bump structures $B_1$* and $B_2$*, flux is removed. Due to decreased pitch $P_2$ between copper post bumps 121* and 126* and reduced standoff $S_2$, flux is difficult to remove in some regions of chip package 122*. In addition, the presence of bridged region 123' makes the removal of flux even more difficult to remove in some regions of chip package 122*. FIG. 1E shows residual flux 128* between bumps $B_1$* and $B_2$* and under bridged region 123'. Residual flux 128* could cause void(s) in underfill. After flux is removed, underfill 127* is formed. The reduced space between bridged region 123' and residual flux 128* causes a void 129* to be formed in underfill 127*. Void 129* could cause early bump failure during device operation due to insufficient bump strength and poor underfill protection. Because there are various problems that are caused by poor formation of bump structures $B_1$* and $B_2$*, properly forming bump structures between packages is important to improve yield and reliability for advanced packaging with smaller pitch, smaller copper post width, and lower standoff.

Figure 2A:
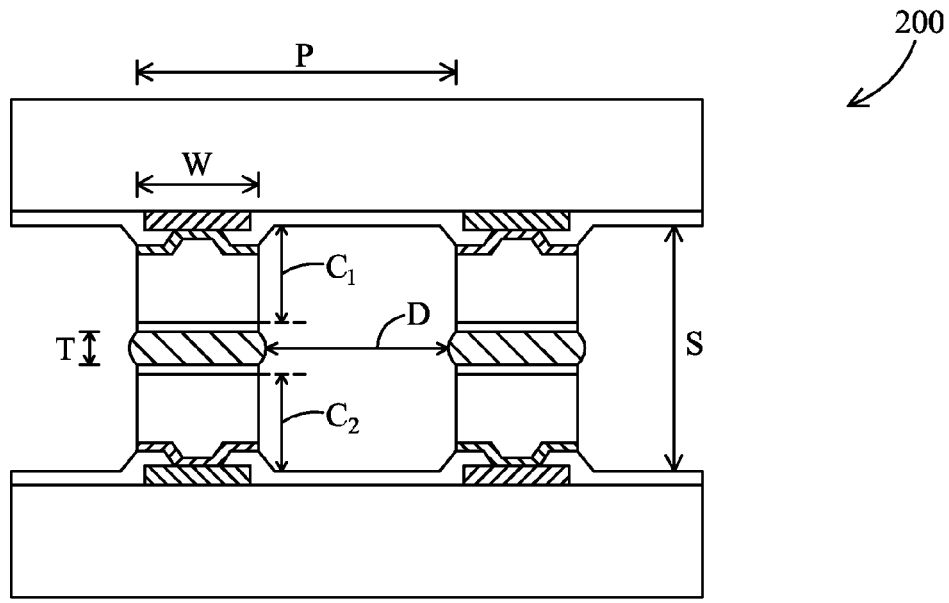
FIG. 2A is a cross-sectional view of a chip package, in accordance with some embodiments.
Figure 2B:
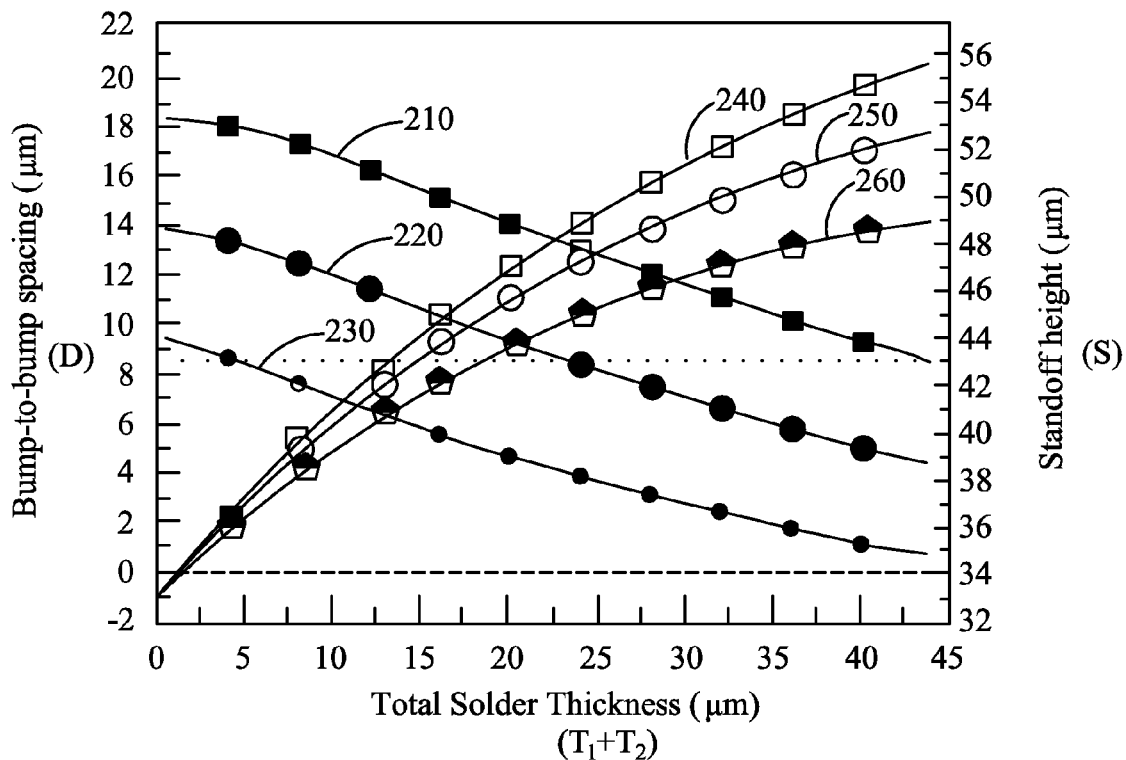
FIG. 2B is a graph of bump pitches, bump-to-bump spacing, and standoff height versus total thickness of solder layers, in accordance with some embodiments.

FIG. 2A is a cross-sectional view of chip package 200, in accordance with some embodiments. Chip package 200 is similar to chip package 122* and chip package 200 has a standoff S, and a pitch P. The width of copper layer of the copper post structures is W. The thickness of a solder layer T is approximately equal to an added thickness of solder layer for copper post bump 121 ($T_1$) on chip and for copper post bump 126 ($T_2$) on substrate when $T_1+T_2$ is small. $T_1$ and $T_2$ are defined in FIG. 1B. Where $T_1+T_2$ is larger; T is noticeably smaller than $T_1+T_2$ due to merged solder material (in solder junction 123) and solder protruding beyond the boundaries of copper posts. The height of the copper layer of copper post bump 121 is $C_1$ and the height of copper layer of copper post bump 126 is $C_2$. The narrowest distance between neighboring solder layers is D (or bump-to-bump spacing). FIG. 2B is a graph of bump pitches, bump-to-bump spacing, and standoff height versus total thickness of solder layers ($T_1+T_2$), in accordance with some embodiments. In some embodiments, $T_1$ is equal to $T_2$. FIG. 2B depicts D decreases with an increase of total solder thickness ($T_1+T_2$). When solder layer become thicker, the protruding portion of the solder layer becomes larger, which decreases bump-to-bump spacing D.

FIG. 2B shows calculated results of three different bump designs, in accordance with some embodiments. In the examples in FIG. 2B, the width of the copper post is half the pitch size. Curve 210 represents variation of bump-to-bump spacing D with solder thickness T for bumps with 40 μm pitch (P) and 20 μm width W of copper layer. Curve 220 is similar to curve 210; however, the pitch for curve 220 is 30 μm and the width W is 15 μm. Similarly, the pitch for curve 230 is 20 μm and the width W is 10 μm. The data of curves 210-230 show that bump-to-bump spacing D decreases with reduced pitch P and reduced width W. The bump-to-bump spacing D decreases with increase in total bump thickness ($T_1+T_2$). When $T_1+T_2$ is larger, more solder at joined solder 123 protrudes outwardly. As a result, the bump-to-bump spacing D is decreased.

Advanced packaging utilizes smaller pitch sizes (P) with smaller bump widths (W). The reduced bump-to-bump spacing D makes advanced packaging more challenging. FIG. 2B shows that the bump-to-bump spacing D for the smallest bump pitch P and width W, 20 μm P and 10 μm W, is almost zero (shorting) when the total solder thickness T is about 45 μm. In contrast, the bump-to-bump spacing D is about 8 when the total solder thickness T is about 45 μm for bumps with 40 μm bump pitch and 20 μm bump width. FIG. 2B shows that the allowable total thickness of solder layer would decrease with reduced pitch size and bump width.

FIG. 2B is also a graph of the standoff S versus total solder thickness ($T_1+T_2$) for three copper widths when $C_1$ (height of copper layer for bump 121) and $C_2$ (height of copper layer for bump 126) are both 15 μm. The copper post width for curve 240 is 20 μm. The copper post width for curve 250 is 15 μm and the copper post width for curve 260 is 10 μm. The standoff increases with the increase of the total thickness of solder layers for all three curves. However, the rate of increase is more for bumps with larger copper width because more solder is available to increase standoff (total height) of the bump structure.

Figure 3A:
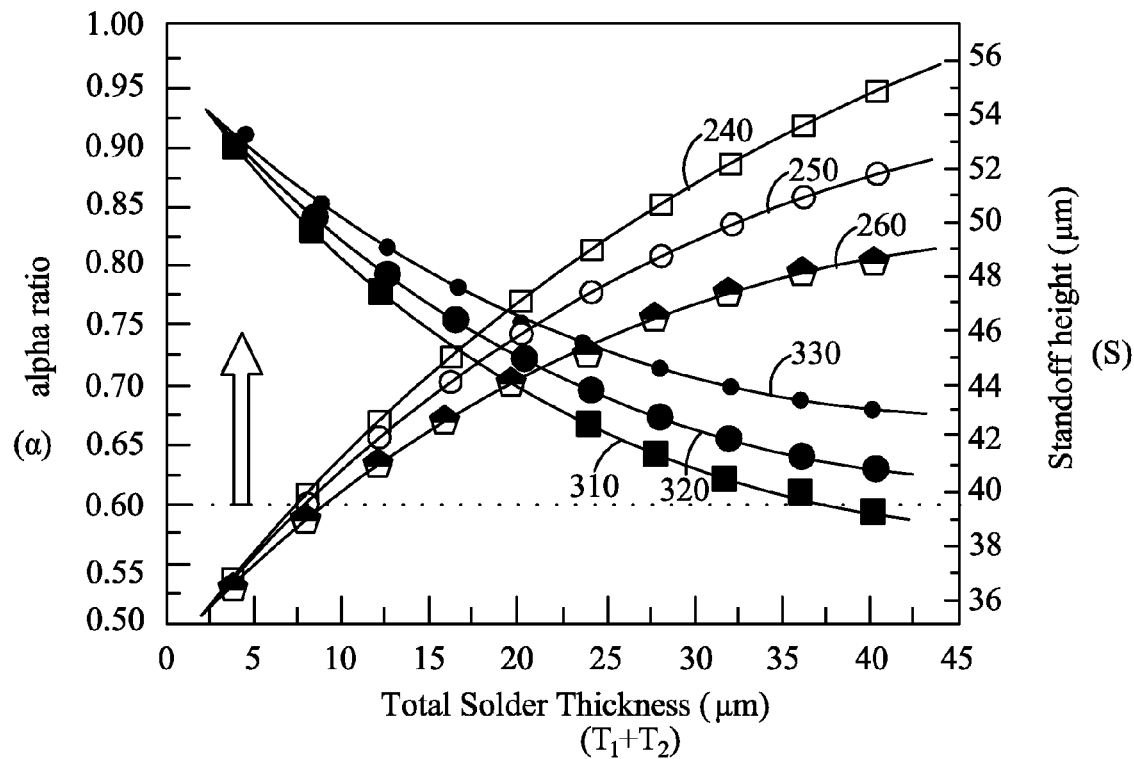
FIG. 3A is a graph of α ratios and standoff height for copper post widths of 20 μm, 15 μm, and 10 μm versus total solder thickness, in accordance with some embodiments.

FIG. 3A is a graph of an alpha (α) ratio as a function of total thickness of solder layers ($T_1+T_2$), in accordance with some embodiments. The α ratio is define as a ratio of $C_1+C_2$ (total copper height) to S (standoff). FIG. 3A includes three curves of the α ratio. In the example of FIG. 3A, $C_1=C_2=15$ μm. Curve 310 is calculated α ratio results for a width of copper layer of 20 μm. Curve 320 is calculated α ratio results for a width of copper layer of 15 μm. Curve 330 is calculated α ratio results for a width of copper layer of 10 μm. When the total thickness $T_1+T_2$ of solder layer increases, the α ratio decreases due to an increase in standoff height S. Curves 240, 250 and 260 for standoff (s) of FIG. 2B are also shown in FIG. 3A. Since S increases faster for copper layer with larger width, curve 330 is above curves 310 and 320. All α ratios in FIG. 3A are above about 0.6 when the total solder thickness is equal to or less than about 40 μm. As mentioned above, when the total solder thickness is at about 45 μm, there is a risk of shorting (or zero bump-to-bump spacing) for bumps with small pitch and width (P=20 μm and W=10 μm). There is reduced risk of shorting when the total solder thickness is equal to or less than about 40 μm even for bumps with small pitch and width (P=20 μm and W=10 μm).

Figure 3B:
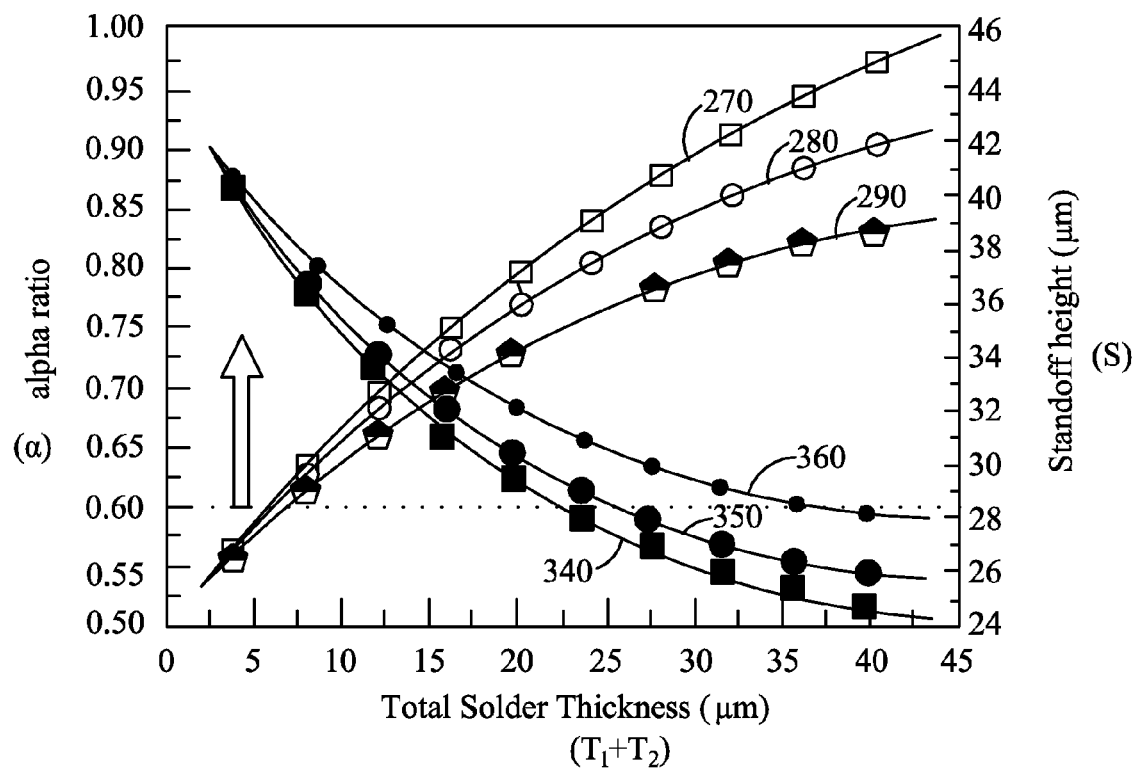
FIG. 3B is a graph of α ratios and standoff height for copper post widths of 20 μm, 15 μm, and 10 μm versus total solder thickness, in accordance with some embodiments.

FIG. 3B is a graph of α ratios and standoffs S for copper post widths of 20 μm, 15 μm, and 10 μm, in accordance with some embodiments. For the standoffs S in FIG. 3B, $C_1=C_2=10$ μm. Curve 270 is calculated standoffs for a width of copper layer of 20 μm. Curve 280 is calculated S results for a width of copper layer of 15 μm. Curve 290 is calculated S results for a width of copper layer of 10 μm. FIG. 3B also includes the α ratio as a function of total solder thickness. In FIG. 3B, Curve 340 is the α ratio for a copper post having a width of 20 μm. Curve 350 is the α ratio results for a copper post having a width of 15 Curve 360 is the α for a copper post having a width of 10 The α ratios for lower height of copper layer ($C_1=C_2=10$ μm) in FIG. 3B are lower than the α ratios in FIG. 3A ($C_1=C_2=15$ μm). Although the results depicted in FIGS. 3A and 3B are for copper posts with circular top views, the result trends are similar for copper posts with different shapes of top views.

The results in FIG. 2B illustrate that for bump structures with finer width W, the total solder thickness T is lower than bump structures with larger width W. This is demonstrated by curve 240 being higher than curve 260, since increased total solder thickness T increases standoff S. As mentioned above, the total solder thickness $T_1+T_2$ is set to be equal to or less than about 40 μm to avoid shorting for bumps as small as 20 μm pitch and 10 μm width. The results in FIGS. 3A and 3B illustrate that the α ratios of the bump structures are higher for bump structures with finer pitches. In some embodiments, the α ratio is equal to or greater than about 0.6 to avoid shorting. The upper limit of the α ratio is 1.0. In some embodiments, the α ratio is equal to or greater than about 0.55. In some embodiments, the α ratio is equal to or greater than about 0.5. As mentioned above, the lower limit of the α ratio depends on the width and height of the copper post. When the α ratio is too low, there is an increased risk of shorting.

Figure 4A:
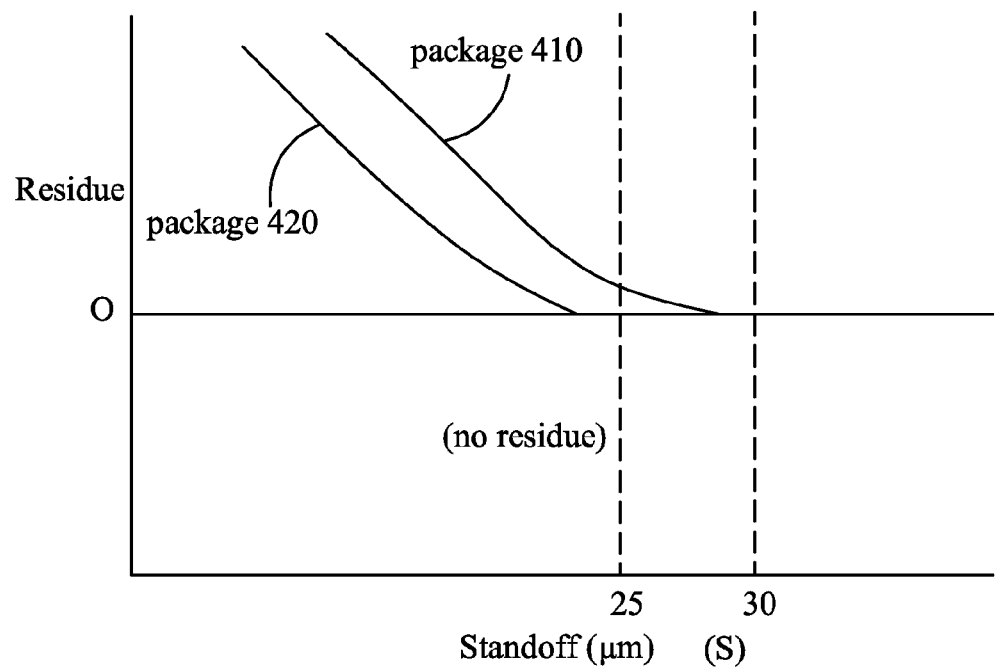
FIG. 4A is a graph of residue of flux cleaning for two packages as a function of standoff, in accordance with some embodiments.

In addition to defining limits for total solder thickness T and the α ratio, standoff (S) limit is also important. FIG. 4A is a graph of residue of flux cleaning for a package A (curve 410) with a large chip and a package B (curve 420) with a small chip as a function of standoff S, in accordance with some embodiments. The total surface area of package B is smaller than package A. During flux removing, if the standoff is too small, the flux between the chip and substrate cannot be removed completely and leaves residue behind. Packages with higher standoffs are easier to clean because the cleaning solution more easily reaches the space between the chip and the substrate.

In addition to standoff, flux cleaning is also affected by chip size on the package. For larger packages (or packages with larger surface areas), flux cleaning solution and/or rising liquid need to travel further into the space between the chip and the substrate to remove flux near the center of the package. In contrast, for smaller packages, flux removal solution and/or rising liquid do not need to travel a long distance to reach flux near the center of the package. As illustrated in FIG. 4A, the flux removing curve 410 for package A has more residue than the curve 420 for package B when the standoff is the same for both packages. The goal of flux removal is to have no residue. The limit of standoff S for complete flux removal is equal to or greater than about 30 μm, in some embodiments. In some embodiments, the limit of standoff S for complete flux removal is equal to or greater than about 25 μm. The limit of standoff depends on the package size. Further, the limit of standoff is also affected by pattern density. In some embodiments, the limit of standoff increases with pattern density.

Standoff also affects void formation. Lower standoff has higher risk of forming voids, which is related to flux removal. As described above, flux residue increases the risk of underfill void formation. In some embodiments, the limit of standoff S for preventing underfill void formation is equal or greater than about 30 μm. In some embodiments, the limit of standoff S is equal to or greater than about 25 μm. The limit of standoff also depends on the package size and pattern density.

Figure 4B:
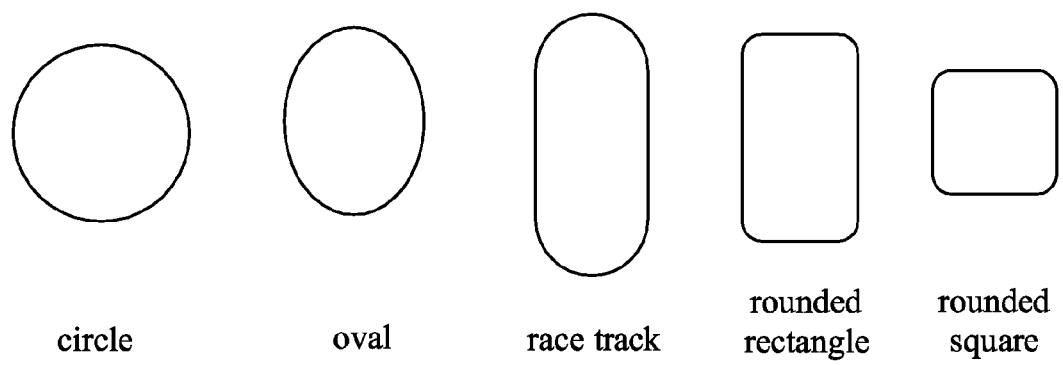
FIG. 4B is various top views of copper post bumps, in accordance with some embodiments.

For advanced packaging, the widths and pitches of copper post bumps continue to decrease. In some embodiments, the width (W) of the copper post is equal to or less than about 30 µm. In some embodiments, the pitch (P) of the copper post is equal to or less than about 60 µm. FIG. 4B shows various top views of copper post bumps, in accordance with some embodiments. The copper post bumps may have a top view of circle, oval, race track, rounded rectangle (rounded corners), rounded square, etc. Other shapes are also possible.

In addition, the aspect ratio of the copper layer (or pillar) may also be also important. Aspect ratio, A, of the copper layer is defined to the ratio of height H of the copper layer to the width W of the copper layer, as shown in FIG. 1B. A minimal value of aspect ratio reduces the risk of the standoff being below the limit of standoff. In some embodiments, aspect ratio is equal to or greater than about 0.45.

The mechanisms for forming bump structures described above enable forming bump structures between a chip and a substrate eliminating or reducing the risk of solder shorting, flux residue and voids in underfill. A lower limit can be established for a α ratio, defined by dividing the total height of copper posts in a bonded bump structure divided by the standoff of the bonded bump structure, to avoid shorting. A lower limit may also be established for standoff of the chip package to avoid flux residue and underfill void formation. Further, aspect ratio of a copper post bump has a lower limit to avoid insufficient standoff and a higher limit due to manufacturing process limitation. By following proper bump design and process guidelines, yield and reliability of chip packages may be increases.

One aspect of this description relates to a method of forming a chip package. The method includes providing a chip with a plurality of first bumps, wherein the plurality of first bumps has a first height. The method further includes providing a substrate with a plurality of second bumps, wherein the plurality of second bumps has a second height. The method further includes bonding the plurality of first bumps to the plurality of second bumps to form a first bump structure of the chip package, wherein the first bump structure has a standoff, wherein a ratio of a sum of the first height and the second height to the standoff is equal to or greater than about 0.6 and less than 1.

Another aspect of this description relates to a chip package. The chip package includes a bump structure bonding a chip and a substrate, wherein the bump structure comprises at least one copper post and a solder layer, wherein a ratio of a sum of a height of each copper post of the at least one copper post to a standoff between the chip and the substrate is equal to or greater than about 0.6 and less than 1. The chip package further includes an underfill between the chip and the substrate, wherein the underfill is free of voids.

Still another aspect of this description relates to a chip package. The chip package includes a first bump structure bonding a chip and a substrate, wherein the first bump structure comprises at least one first copper post and a first solder layer, wherein a ratio of a sum of a height of each first copper post of the at least one first copper post to a standoff between the chip and the substrate is equal to or greater than about 0.6 and less than 1. The chip package further includes a second bump structure bonding the chip to the substrate, wherein the second bump structure comprises at least one second copper post and a second colder layer. The chip package further includes an underfill between the chip and the substrate, wherein the underfill is free of voids.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A chip package, comprising:
   a bump structure bonding a chip and a substrate, wherein the bump structure comprises a first post, a second post, and a solder layer disposed between and bonding together the first and second posts, wherein a ratio of a sum of a height of the first and second posts to a standoff between the chip and the substrate is equal to or greater than 0.5 and less than 1, wherein a portion of at least one sidewall of the first post and a portion of at least one sidewall of the second post are free of the solder layer; and
   an underfill between the chip and the substrate.

2. The chip package of claim 1, wherein the standoff is equal to or greater than 25 microns (µm).

3. The chip package of claim 1, wherein the first post in a top view has a shape selected from the group consisting of circle, oval, race track, rounded rectangle and rounded square.

4. The chip package of claim 1, wherein an aspect ratio of the first-post is equal to or greater than 0.45.

5. The chip package of claim 1, wherein at least a portion of sidewalls of the first post are free of the solder layer.

6. The chip package of claim 1, wherein a width of the first post ranges from 10 µm to 20 µm.

7. A chip package, comprising:
   a first bump structure bonding a chip and a substrate, wherein the first bump structure comprises a first copper post on the chip, a second copper post on the substrate, and a first solder layer interposing the first and second copper posts, wherein a ratio of a sum of a height of the first copper post and the second copper post to a standoff between the chip and the substrate is equal to or greater than 0.5 and less than 1;
   a second bump structure bonding the chip to the substrate, the second bump structure spaced a distance from the first bump structure, wherein the second bump structure comprises a third copper post and a fourth copper post and a second solder layer interposing the third and fourth copper posts; and
   an underfill between the chip and the substrate, wherein the underfill interfaces the first solder layer and wherein the underfill physically interfaces at least a portion of a sidewall of the first copper post and physically interfaces at least a portion of a sidewall of the second copper post.

8. The chip package of claim 7, wherein a pitch between the first bump structure and the second bump structure is less than or equal to 60 microns (µm).

9. The chip package of claim 7, wherein a width of the first copper post is equal to half of a pitch between the first bump structure and the second bump structure.

10. The chip package of claim 7, wherein at least one of the first and second copper posts in a top view has a shape selected from the group consisting of circle, oval, race track, rounded rectangle and rounded square.

11. The chip package of claim 7, wherein the first solder layer and the second solder layer are spaced a distance apart and wherein a pitch between the first bump structure and the second bump structure is substantially equal to or less than 40 microns and the distance between the first and second solder layer is less than 20 microns.

12. The chip package of claim 7, wherein the first solder layer and the second solder layer are spaced a distance D apart and the first solder layer has a thickness T, and wherein a ratio of D to T is greater than 1.6.

13. A chip package, comprising:
a bump structure bonding a chip and a substrate, wherein the bump structure includes:
  a first copper post having a first metal layer disposed thereon;
  a second copper post having a second metal layer disposed thereon, wherein the first and second metal layers are disposed between the first and second copper posts; and
  a solder layer disposed between the first and second copper posts and between the first and second metal layers, wherein a ratio of a sum of a height of the first and second copper posts to a standoff between the chip and the substrate is equal to or greater than 0.5 and less than 1, and
  wherein the solder layer has a sidewall that extends from a first termination point at an interface with a sidewall of the first metal layer to a second termination point at an interface with a sidewall of the second metal layer;
a passivation layer disposed on the chip, wherein the passivation layer has an opening;
a metal pad disposed in the opening, wherein the bump structure is coupled to the metal pad; and
an underfill between the chip and the substrate.

14. The chip package of claim 13, wherein the first metal layer is a nickel-containing metal layer.

15. The chip package of claim 13, wherein a width of the first copper post is equal to or less than 30 µm.

16. The chip package of claim 13, wherein a shape of the first copper post is selected from the group consisting of a circle, an oval, a race track, a rounded rectangle and a rounded square.

17. The chip package of claim 13, wherein at least a portion of sidewalls of the first copper post and the second copper post are free of the solder layer.

18. The chip package of claim 13, wherein a width of the solder layer is greater than a width of the first copper post.

19. The chip package of claim 13, further comprising a semiconductor device, wherein the bump structure is electrically connected to the semiconductor device.

20. The chip package of claim 13, further comprising an under bump metallurgy (UBM) layer, wherein the first copper post is between the UBM layer and the solder layer, and wherein the UBM is between the metal pad and the at least one copper post.

* * * * *